United States Patent
Dijksman et al.

(10) Patent No.: US 9,715,174 B2
(45) Date of Patent: Jul. 25, 2017

(54) DROPLET GENERATOR, EUV RADIATION SOURCE, LITHOGRAPHIC APPARATUS, METHOD FOR GENERATING DROPLETS AND DEVICE MANUFACTURING METHOD

(71) Applicant: ASML Netherlands B.V., Veldhoven (NL)

(72) Inventors: Johan Frederik Dijksman, Weert (NL); Ramin Badie, Eindhoven (NL); Ronald Johannes Hultermans, Waalre (NL); Dzmitry Labetski, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 50 days.

(21) Appl. No.: 14/443,965

(22) PCT Filed: Oct. 30, 2013

(86) PCT No.: PCT/EP2013/072689
§ 371 (c)(1),
(2) Date: May 19, 2015

(87) PCT Pub. No.: WO2014/082811
PCT Pub. Date: Jun. 5, 2014

(65) Prior Publication Data
US 2015/0293456 A1    Oct. 15, 2015

Related U.S. Application Data

(60) Provisional application No. 61/751,200, filed on Jan. 10, 2013, provisional application No. 61/732,087, filed on Nov. 30, 2012.

(51) Int. Cl.
*G03B 27/54*      (2006.01)
*G03F 7/20*       (2006.01)
(Continued)

(52) U.S. Cl.
CPC .......... *G03F 7/70033* (2013.01); *B05B 17/06* (2013.01); *H05G 2/005* (2013.01); *H05G 2/006* (2013.01); *H05G 2/008* (2013.01)

(58) Field of Classification Search
CPC ..... B05B 17/06; G03F 7/70033; H05G 2/005; H05G 2/006; H05G 2/008
(Continued)

(56) References Cited

U.S. PATENT DOCUMENTS

| 2003/0122888 A1 | 7/2003 | Baba et al. |
| 2003/0223546 A1 | 12/2003 | McGregor et al. |

(Continued)

FOREIGN PATENT DOCUMENTS

| EP | 1 367 441 | 12/2003 |
| WO | WO 2013/020758 | 2/2013 |

OTHER PUBLICATIONS

International Search Report mailed Feb. 3, 2014 and published Jun. 5, 2014 for corresponding International Patent Application No. PCT/EP2013/072689 (3 pages).

*Primary Examiner* — Peter B Kim
(74) *Attorney, Agent, or Firm* — Pillsbury Winthrop Shaw Pittman LLP

(57) ABSTRACT

A droplet generator, for an EUV radiation source, comprises: a capillary in which, in use, molten material flows; an actuator configured to modulate a pressure inside the capillary; and a controller configured to drive the actuator at a driving frequency; wherein the droplet generator is arranged such that, in use, the driving frequency is equal or about equal to a main resonance frequency of the molten material in the capillary.

12 Claims, 5 Drawing Sheets

(51) Int. Cl.
*H05G 2/00* (2006.01)
*B05B 17/06* (2006.01)

(58) Field of Classification Search
USPC .......................................................... 355/67
See application file for complete search history.

(56) References Cited

U.S. PATENT DOCUMENTS

| | | |
|---|---|---|
| 2006/0192155 A1 | 8/2006 | Algots et al. |
| 2012/0228526 A1 | 9/2012 | Vaschenko |
| 2013/0062538 A1 | 3/2013 | Kodama et al. |

DROPLET GENERATOR, EUV RADIATION SOURCE, LITHOGRAPHIC APPARATUS, METHOD FOR GENERATING DROPLETS AND DEVICE MANUFACTURING METHOD

CROSS-REFERENCE TO RELATED APPLICATIONS

This application is the U.S. national stage entry of International patent application No. PCT/EP2013/072689, filed on 30 Oct. 2013, which claims the benefit of U.S. provisional application 61/732,087, which was filed on 30 Nov. 2012 and U.S. provisional application 61/751,200 which was filed on 10 Jan. 2013, and which are incorporated herein in its entirety by reference.

FIELD

The present invention relates to a droplet generator, an EUV radiation source, a lithographic apparatus, a method for generating droplets and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

In EUV lithographic systems for the semiconductor industry the source for making the required power of EUV light can be based on different principles, such as Laser Produced Plasma (LPP), Discharge Produced Plasma (DPP), Laser Assisted Discharge Produced Plasma, Synchotron Radiation. In a LPP (for example) source a stream of tiny droplets of molten tin travels through the focal point of the source. The droplets may be produced with a method called low frequency modulated continuous jet. With this method a continuous jet is decomposed into small droplets by a high frequency close to the Rayleigh frequency. These droplets because of the low frequency modulation, however, do have slightly different velocities, in course of their flight high speed droplets overtake low speed droplets and coalesce into larger droplets spaced at a large distance. The large distance is needed to avoid the plasma influencing the trajectory of the droplets. Instability in the droplet coalescence and/or late coalescence can cause problems in producing the EUV photons at the focal point of the source.

Therefore, it is desirable to provide a system in which droplet coalescence will be more stable, and/or full coalescence will be reached at a shorter distance.

According to an aspect of the invention, there is provided a droplet generator, for an EUV radiation source, comprising: a capillary in which, in use, molten material flows; an actuator configured to modulate a pressure inside the capillary; and a controller configured to drive the actuator at a driving frequency; wherein the capillary comprises a Helmholtz resonator.

In an embodiment, the droplet generator is arranged such that, in use, the driving frequency is equal or about equal to a main resonance frequency of the molten material in the capillary.

According to an aspect of the invention, there is provided an EUV radiation source comprising a droplet generator that comprises: a capillary in which, in use, molten material flows; an actuator configured to modulate a pressure inside the capillary; and a controller configured to drive the actuator at a driving frequency; wherein the droplet generator is arranged such that, in use, the driving frequency is equal or about equal to a main resonance frequency of the molten material in the capillary.

According to an aspect of the invention, there is provided a lithographic apparatus comprising an EUV radiation source comprising a droplet generator that comprises: a capillary in which, in use, molten material flows; an actuator configured to modulate a pressure inside the capillary; and a controller configured to drive the actuator at a driving frequency; wherein the droplet generator is arranged such that, in use, the driving frequency is equal or about equal to a main resonance frequency of the molten material in the capillary.

According to an aspect of the invention, there is provided a method for generating droplets for an EUV radiation source, said method comprising: flowing molten material in a capillary, wherein the molten material has a main resonance frequency in the capillary; and modulating a pressure inside the capillary at a driving frequency that is equal or about to said main resonance frequency.

According to an aspect of the invention, there is provided a device manufacturing method using a lithographic apparatus, the method comprising the steps of: generating droplets for an EUV radiation source, wherein said generating step comprises: flowing molten material in a capillary, wherein the molten material in the capillary has a main resonance frequency; and modulating a pressure inside the capillary at a driving frequency that is equal or about equal to said main resonance frequency.

According to an aspect of the invention, there is provided a droplet generator, for an EUV radiation source, including a capillary in which, in use, molten material, such as molten tin, molten xenon or molten lithium, flows, an actuator configured to modulate a pressure inside the capillary and a controller configured to drive the actuator at a driving frequency; wherein the capillary comprises a Helmholtz resonator.

The capillary may include an upstream end mounted into a stiff housing.

The capillary may include a damper configured to dampen vibrations upstream of the damper, wherein the capillary comprises a portion downstream of the damper, said portion having a volume less than or equal to about 1 $mm^3$, and optionally less than or equal to about 0.1 $mm^3$.

The capillary may include a damper configured to dampen vibrations upstream of the damper, wherein the droplet generator is arranged such that, in use, the driving frequency is equal or about equal to a main resonance frequency of the molten material in the capillary. The driving frequency, for instance a frequency modulated or an amplitude modulated driving frequency, may be for controlling coalescence of droplets generated by the droplet generator.

The capillary may include a downstream end having a nozzle configured to eject droplets, wherein an inner cross sectional area of the capillary decreases towards the nozzle.

The droplet generator may include a molten material reservoir, such as a molten tin reservoir, configured to generate a molten material flow in the capillary.

In use, the main resonance frequency of the molten material is greater than or equal to about 80 kHz.

The capillary may include a damper configured to dampen vibrations upstream of the damper, wherein the droplet generator is arranged such that, in use, the driving frequency is equal or about equal to a main resonance frequency of the molten material in the capillary. The main resonance frequency of the molten material may be greater than of equal to about 80 kHz.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
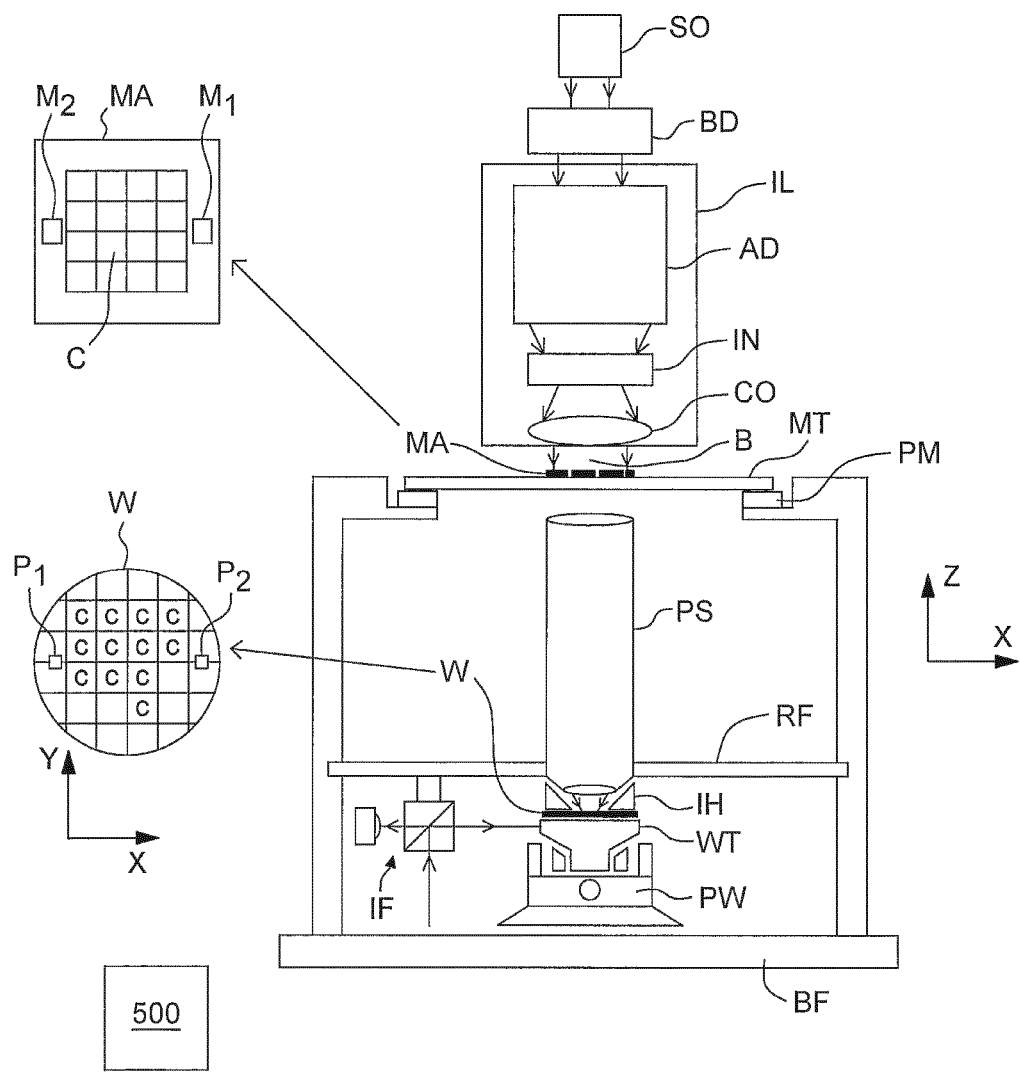
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) Ma and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device Ma onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "projection system" used herein should be broadly interpreted as encompassing any type of system, including refractive, reflective, catadioptric, magnetic, electromagnetic and electrostatic optical systems, or any combination thereof, as appropriate for the exposure radiation being used, or for other factors such as the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device Ma, the radiation beam B passes through the projection system PS, which focuses the beam onto a target portion C of the substrate W. Substrate W is held on the substrate table WT by a substrate holder according to an embodiment of the present invention and described further below. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device Ma with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device Ma and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A control system 500 shown in FIG. 1 controls the overall operations of the lithographic apparatus and in particular performs an optimization process described further below. Control system 500 can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 2:
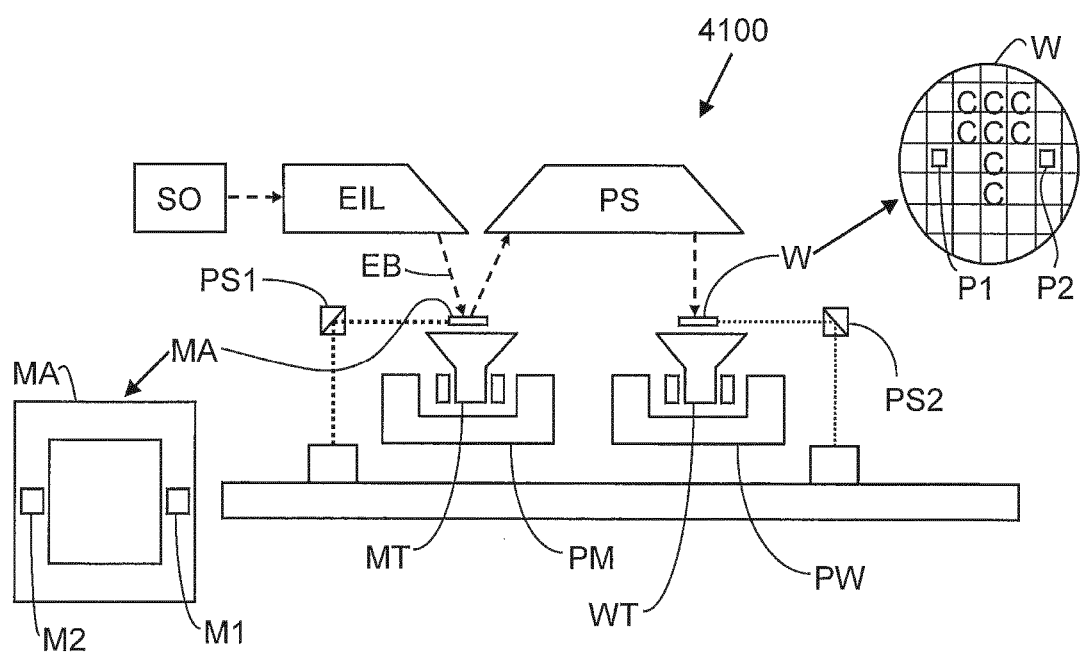
FIG. 2 depicts a lithographic apparatus according to an embodiment of the invention.

FIG. 2 schematically depicts an EUV lithographic apparatus 4100 including a source collector apparatus SO. The apparatus comprises:

an illumination system (illuminator) EIL configured to condition a radiation beam B (e.g. EUV radiation);

a support structure (e.g. a mask table) MT constructed to support a patterning device (e.g. a mask or a reticle) Ma and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

These basic components of the EUV lithographic apparatus are similar in function to the corresponding components of the lithographic apparatus of FIG. 1. The description below mainly covers areas of difference and duplicative description of aspects of the components that are the same is omitted.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 2, the EUV illuminator EIL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 2, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge-produced plasma EUV generator, often termed as a DPP source.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) Ma, which is held on the support structure (e.g., mask table) MT, and is patterned by the patterning device. After being reflected from the patterning device (e.g. mask) Ma, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) Ma with respect to the path of the radiation beam EB. Patterning device (e.g. mask) Ma and substrate W may be aligned using mask alignment marks M1, M2 and substrate alignment marks P1, P2.

The depicted apparatus can be used in the same modes as the apparatus of FIG. 1.

Figure 3:
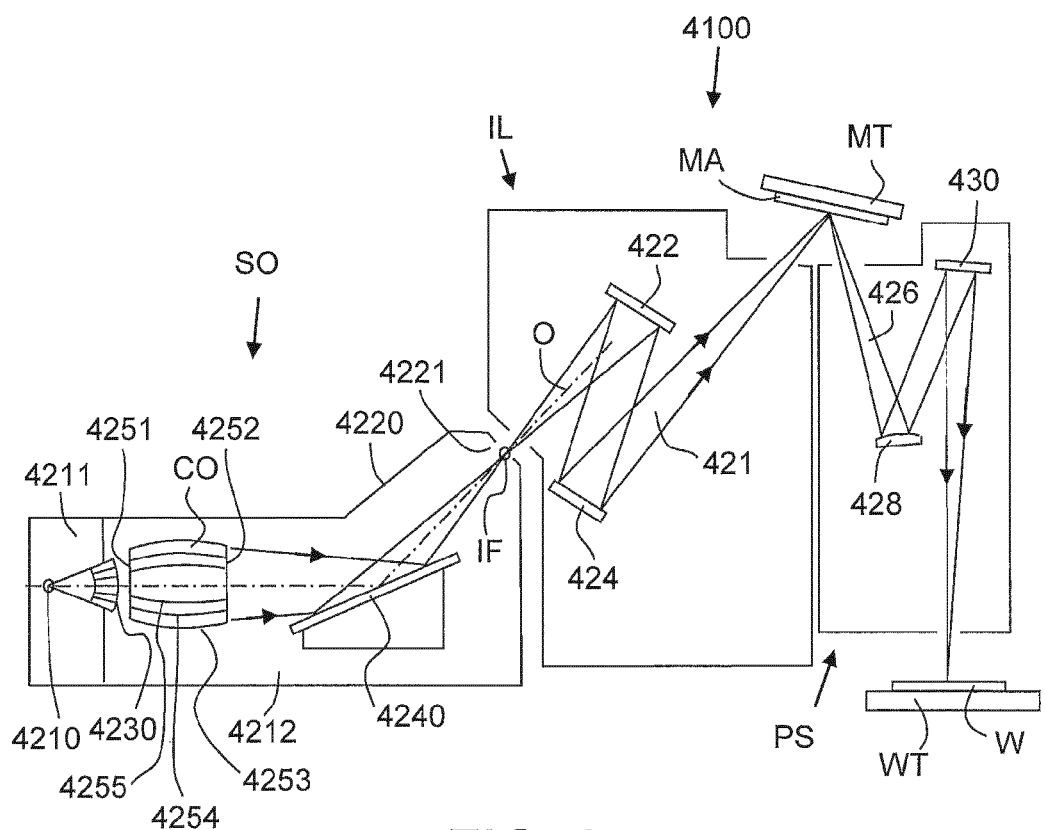
FIG. 3 is a more detailed view of the apparatus of FIG. 2.

FIG. 3 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum. The plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211. The contaminant trap 4230 may include a channel structure. Contamination trap 4230 may also include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device Ma, as well as a desired uniformity of radiation intensity at the patterning device Ma. Upon reflection of the beam of radiation 421 at the patterning device Ma, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be from 1 to 6 additional reflective elements present in the projection system PS than shown in FIG. 3.

Collector optic CO, as illustrated in FIG. 3, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Figure 4:
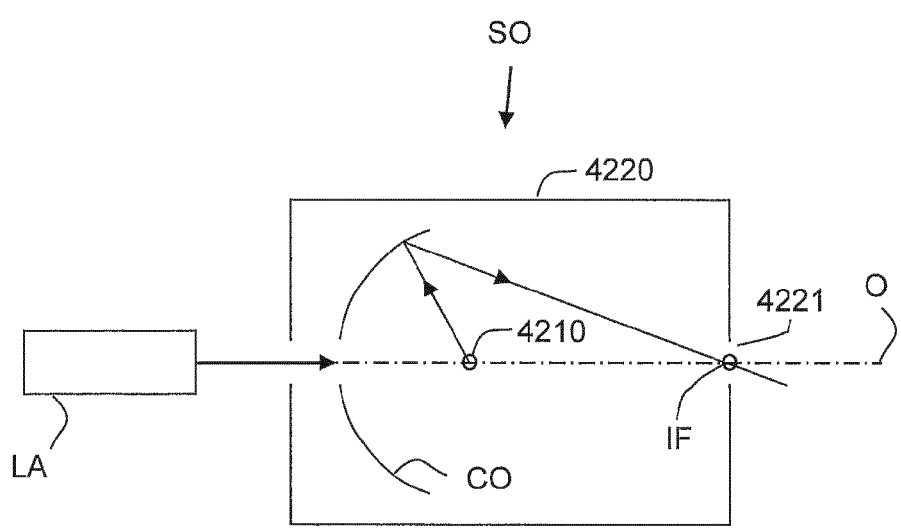
FIG. 4 is a more detailed view of the source collector apparatus of the apparatus of FIGS. 2 and 3.

Alternatively, the source collector apparatus SO may be part of an LPP radiation system as shown in FIG. 4. A laser LA is arranged to deposit laser energy into a fuel, such as xenon (Xe), tin (Sn) or lithium (Li), creating the highly ionized plasma 4210 with electron temperatures of several 10's of eV. The energetic radiation generated during de-excitation and recombination of these ions is emitted from the plasma, collected by a near normal incidence collector optic CO and focused onto the opening 4221 in the enclosing structure 4220.

In EUV lithographic systems for the semiconductor industry the source for making the required power of EUV light can be based on different principles, such as Laser Produced Plasma (LPP), Discharge Produced Plasma (DPP), Laser Assisted Discharge Produced Plasma, and Synchotron Radiation. In this invention disclosure the description is confined to LPP (laser produced plasma), but may be applicable to other ways of producing plasma, where appropriate.

Figure 5:
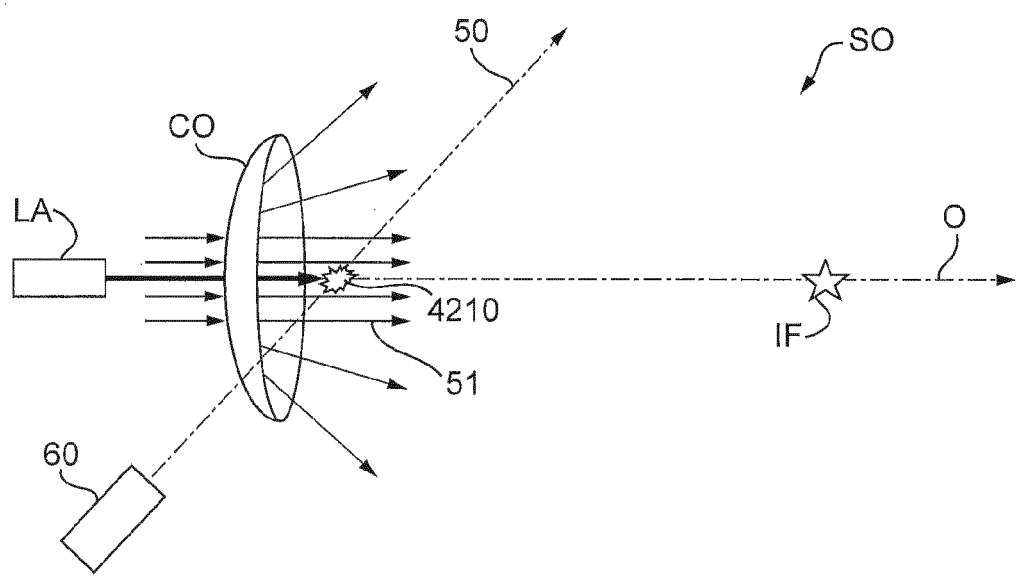
FIG. 5 depicts a schematic showing the arrangement of basic parts of an LPP source of an embodiment of the invention.

FIG. 5 depicts a source collector apparatus SO according to an embodiment of the invention. A droplet generator 60 generates droplets of molten material. The droplets of molten material travel in the droplet direction 50. In an embodiment the material is tin. In a LPP source a stream of tiny droplets of molten tin travels through the focal point of the source.

A laser LA generates a laser beam. The laser beam is directed along the optical axis O. The laser LA produces the laser beam in pulses. In an embodiment the laser LA produces the laser beam such that the laser beam has a pulse energy of about 0.4 J per pulse. The laser beam is directed to the droplets of molten material so as to create a plasma 4210. In an embodiment the laser is a $CO_2$. In the focal point the droplets are heated up to an extremely high temperature by a $CO_2$ laser and a plasma is formed of high energy tin ions and electrons.

Radiation is emitted from the plasma 4210. In the plasma the tin molecules are stripped of 10 to 14 of their outer electrons. Upon restoring their electron shields EUV photons are emitted. The collector CO collects the radiation emitted from the plasma 4210. A flow of gas 51 is generated so as to keep the collector CO clean. The intermediate focus IF is the virtual source point.

Figure 6:
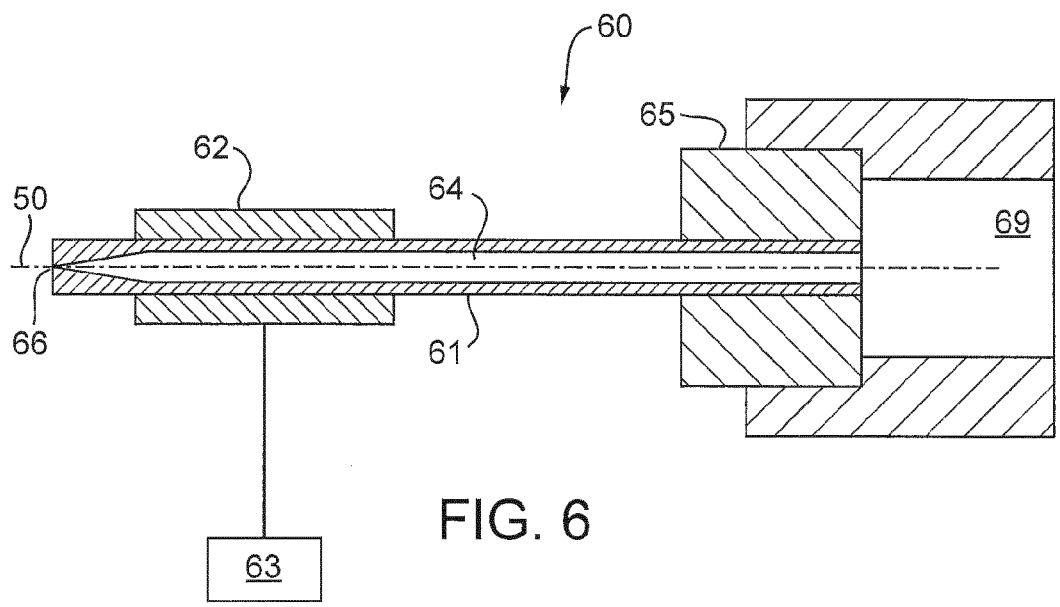
FIG. 6 depicts a droplet generator.

FIG. 6 depicts a droplet generator 60. The droplet generator comprises a capillary 61. An actuator 62 surrounds a part of the capillary 61. The actuator 62 is connected to a controller 63. The controller 63 controls the actuator 62 according to a driving frequency.

The molten material from which droplets of molten material are formed is disposed inside the capillary 61. The molten material 64 passes through the nozzle 66 so as to form droplets of molten material. The capillary extends longitudinally in the droplet direction 50. The capillary 61 is connected via a stiff housing 65 to a reservoir 69 for holding the molten material. In an embodiment the stiff housing 65 is impermeable by the molten material. For example, in an embodiment the stiff housing 65 is molten tin tight.

The droplet generator 60 is used in a source collector apparatus SO as shown in FIG. 5. When the molten material 64 passes through the nozzle 66, the jets of molten material 64 breaks up into droplets. Compared to the way that the jet of molten material 64 naturally breaks up (so-called Rayleigh breakup), it is desirable to produce larger droplets of molten material separated by a greater distance from each other.

In an embodiment of this disclosure, the droplets are supposed to be produced with a method called low frequency modulated continuous jet. With this method a continuous jet is decomposed in small droplets by a high frequency close to the Rayleigh frequency. These droplets, however, because of the low frequency modulation, do have slightly different velocities. In course of their flight high speed droplets overtake low speed droplets and coalesce into larger droplets spaced at a large distance. The large distance is needed to avoid the plasma influencing the trajectory of the droplets.

The controller 63 controls the actuator 62 so as to control the size and separation of the droplets of molten material 64. In an embodiment the controller 63 controls the actuator 62 according to a signal having at least two frequencies. A first frequency is used to control the droplet generator 60 to produce relatively small droplets of molten material 64. This first frequency may be in the region of MHz. The second frequency is a lower frequency in the kHz range. The second frequency of the signal may be used to vary the speed of the droplets as they exit the nozzle 66 of the droplet generator 60. The purpose of varying the speeds of the droplets of molten material 64 is to control the droplets to coalesce with each other so as to form larger droplets of molten material 64, spaced at a corresponding larger distance. Note that, as an alternative to applying a low frequency modulation, an amplitude modulation may be considered as well. As a further alternative to the application of a frequency or amplitude modulated driving frequency, the capillary of the droplet generator may be configured to comprise a Helmholtz resonator, as explained in more detail below.

In order to keep the collector clean from condensing tin, directed hydrogen gas flows transport the contaminating tin vapor and particles away. The amount of tin used is a compromise between EUV power generated and contamination of the inside of the source, especially parts in the optical path, such as the collector.

Tin droplets are about spherical, with a diameter ~30 um, which dimensions are usually less than the minimal dimension of the waist of the focused laser beam being 60-450 μm. Droplets are generated at frequencies between 40 to 80 kHz and fly towards the focus with velocities between 40 to 100 m/s. Desirably the inter-droplet spacing is larger than about 1 mm.

Droplets are generated out of a nozzle 66 at the end of the capillary 61. The actuator controls a pressure inside the capillary 61. The capillary 61 is, for example, surrounded by a tight fitting piezo tube. The actuator 62, e.g. piezo, is driven by the controller 63, e.g. an arbitrary waveform generator, with a signal that at least contains the high frequency to break up the jet and the low frequency to control the coalescence behavior. A certain amount of molten tin is stored in a reservoir 69, e.g. heated vessel, and forced to flow towards the nozzle 66 through a filter (not shown). The flow rate is maintained by a gas pressure above the fluid level in the reservoir 69.

In one embodiment the laser LA is triggered by detection of the shiny surface of the molten droplet, the so called NoMo arrangement (No Master oscillator). In order to control the droplet shape just before the moment the high power pulsed laser LA is switched on, a pre-pulse is used. The triggering of the lasers has to be done by measuring the position of the droplet just before it enters the plasma position.

The following is a description of an embodiment for the low frequency modulated continuous jet. The basic layout and mechanical design are based on the low frequency modulated continuous jet concept.

The basic arrangement of parts in a LPP EUV source are depicted in FIG. 5. FIG. 5 is a schematic showing the arrangement of basic parts of a standard LPP source: the collector, droplet generator (DLG), droplet stream, focus and plasma position, gas flow and intermediate focus (IF). The tin catcher is placed opposite to the DLG. The droplet stream is directed horizontally. The O-axis is pointed upwards with respect to the direction of gravity under an angle between 30° and 60°.

The design of a droplet generator 60 based on the low frequency modulated continuous jet principle consists of a reservoir 69 for molten material, e.g. tin, and a droplet generator 60 mounted at the bottom of the reservoir 69, see FIG. 6. FIG. 6 depicts a layout of a droplet generator.

A capillary 61 made of e.g. glass is mounted to the tin reservoir 69. Before tin flows into the capillary 61 it first passes a filter (not shown) to remove all small contaminating and nozzle clogging particles. The capillary 61 is partly surrounded by an actuator 62, e.g. a tight fitting piezo tube, that is radially polarized.

The droplet generator 60 comprises a small sized capillary 61 with dimensions: length, say, 15-50 mm, inner diameter 0.5 to 0.7 mm and wall thickness 0.15 to 0.25 mm. The end of the capillary 61 facing the reservoir 69 is open; the other end facing the vacuum vessel is shaped like a nozzle 66 with an inner diameter of 3-5 μm.

Around part of the length of the capillary 61 a tube of piezoelectric ceramic is mounted and fixed by a high temperature resistant adhesive. This tube is about 4-10 mm long. By pressurizing the gas above the tin contained in the reservoir, a high speed jet issues from the nozzle 66. Such a jet naturally breaks up after a certain length (typically 100-1000 times the nozzle diameter) in droplets with diameters somewhat less than twice the size of the nozzle and spaced at roughly 4.5 times the nozzle diameter (so called Rayleigh break-up). Both the droplet size and the inter droplet distance vary randomly around the mean values given. By modulating the pressure inside the capillary 61 by activating the piezo, the exit velocity of the nozzle 66 is modulated and the jet breaks up in a controlled manner directly after leaving the nozzle 66. At frequencies around the Rayleigh break-up frequency single droplets are formed, spaced at a distance controlled by the mean exit velocity and the applied frequency.

At frequencies much lower than the Rayleigh frequency, however, single small droplets are formed in strings of alternating high speed droplets and low speed droplets, relative to the mean jet velocity. The high speed droplets overtake the low speed droplets and at some distance from the nozzle 66 large droplets (in comparison with the nozzle diameter) fly at a corresponding large inter-droplet distance.

Problems of the current design include:

The distance between the droplets has to be as large as possible, with a given volume and velocity needed. This leads to the coalescence of many very small droplets. To guide the thinking the following estimate may be used. To end up with droplets with a diameter of 20 μm (volume 4.19 pl), velocity 100 m/s, rate 100 kHz spaced at 1 mm, the volume rate of flow Q has to be:

$Q$=droplet volume*frequency=4.19 pl*100 kHz=4.19*$10^{-10}$ $m^3$/s.

This volume rate of flow has to be forced through a nozzle 66 (radius r) with the prescribed droplet velocity:

$\pi r^2$=$Q$/velocity.

From this equation it follows that r=1.155 μm (diameter 2.31 μm, basic droplet size 44 fl). As 1 mm droplet distance is currently specified for proper operation of the source, a larger distance is preferable to prevent the plasma to push out the droplets entering the plasma position from their trajectories. This means even smaller nozzles, because the only parameter that leads to larger inter-droplet spacing is the velocity. In order to make the large droplets out of strings of smaller ones, it is about the coalescence of about 100 small droplets. Any disturbance of the droplet stream (e.g. coming from the gas flows inside the vacuum chamber to avoid contamination of the mirror and other parts in the optical path) may disturb the coalescence process.

The drive frequency used for droplet formation: 100 kHz, is far lower than the natural frequency of the Rayleigh break-up, being equal to almost 10 MHz. That means that in order to facilitate the jet break-up close to the nozzle higher frequencies must be generated, e.g. by applying a block pulse rather than a sinusoidal drive signal (low frequency modulated continuous jet). A block pulse contains an indefinite number of over tones with decreasing amplitude. It depends on the damping characteristics of the actuator arrangement (mechanics and (power)-electronics) and the fluid contained in the capillary, how much of the high frequency content of the drive signal actually reaches the nozzle.

Coalescence length scales with the velocity, the higher the velocity the longer it takes before all small droplets have been merged into a well controlled stream of large droplets.

The frequency spectrum of the droplet generator is complicated; it consists of acoustic modes belonging to the fluid column contained in the capillary, structural modes of the capillary and the piezo.

The velocity distribution inside the capillary is the result of the multiplication of the spectrum of the applied pulse and the transfer function of the fluid structure interaction of the capillary filled with molten tin. As the nozzle is almost a closed end, the fluid acoustics are mainly governed by the fact that the capillary filled with molten tin is a $\lambda/4$ resonator, of which the resonance frequencies are given by:

$$f_n=(2n-1)*c/4L,$$

with L the length of the capillary and the c speed of sound corrected for the compliance of the glass tube. With c=1250 m/s (valid for molten tin and corrected for the compliance of the wall) and L=25 mm, we have, $f_1$=12.5 kHz, $f_2$=37.5 kHz, $f_3$=62.5 kHz and so on. The damping in tin is small so the resonances are sharp and show a very significant amplitude gain.

This means that when for instance the system is driven with 31.25 kHz block wave, the main motion will be at the resonance at 62.5 kHz, so instead of producing droplets that will coalesce into one droplet with a repeat rate of 31.25 kHz, two droplets with equal velocities at 62.5 kHz will be found, these two droplets will never coalesce into the one desired. The structural resonances of the capillary and piezo are hundreds of kHz up to several MHz. These MHz frequencies are used to control and stabilize the initial Rayleigh droplet break up.

Figure 7:
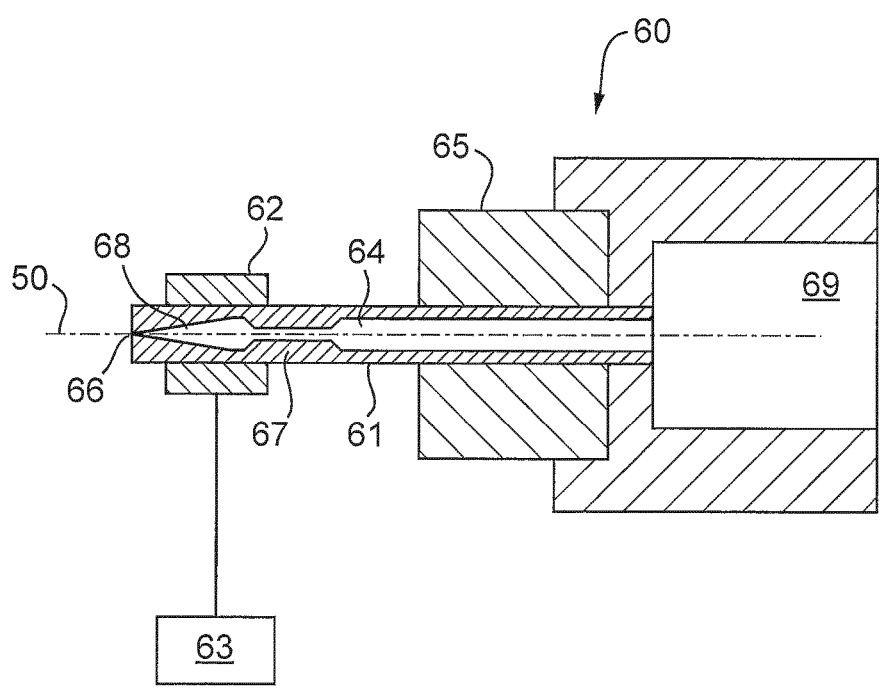
FIG. 7 depicts a droplet generator of an embodiment of the invention.

FIG. 7 depicts a droplet generator 60 according to an embodiment of the invention. The droplet generator 60 depicted in FIG. 7 has some components in common with the droplet generator depicted in FIG. 6. In these cases, the same reference numerals are used in FIGS. 6 and 7.

In an embodiment the droplet generator 60 is for an EUV radiation source. In an embodiment the droplet generator comprises a capillary 61. In use, molten material 64 flows in the capillary 61.

The actuator 62 is configured to modulate a pressure inside the capillary 61. The controller 63 is configured to drive the actuator 62 at a driving frequency. In an embodiment, the droplet generator 60 is arranged such that, in use, the driving frequency is equal or about equal to a main resonance frequency of the molten material 64 in the capillary 61.

By driving the actuator 62 at a driving frequency that is equal or about equal to the main resonance frequency of the molten material 64 in the capillary 61, the undesirable effects of overtones of the capillary 61 are reduced.

The capillary 61 is a resonant system. The capillary 61 is susceptible to motion according to a resonance mode. By driving the actuator 62 at or near the main resonance frequency of the molten material 64 in the capillary 61, the resonance results in a large amplification of that motion. This large amplification reduces the disturbing factors of overtones of the capillary 61.

Accordingly, it is possible to reduce the coalescence length of the system. The relatively small droplets of molten material 64 coalesce to form larger droplets of molten material 64 within a shorter distance from the nozzle 66. The coalescence process can be controlled to a greater extent.

As an alternative to, or in addition to, driving the driving the actuator 62 at a driving frequency that is equal or about equal to the main resonance frequency of the molten material 64 in the capillary 61, the capillary 61 can be configured to comprise a Helmholtz resonator. Such a Helmholtz resonator may e.g. be provided at or near an end of the capillary 61, as illustrated in FIG. 7.

Therefore, in an embodiment the droplet generator 60 is arranged such that it is a Helmholtz resonator. In an embodiment the capillary 61 has substantially only one resonance frequency, namely the Helmholtz resonance frequency. Accordingly, the capillary 61 has no overtones. This eliminates any disturbing factors of overtones in the coalescence process.

In an embodiment the molten material 64 in the capillary 61 is a high Q system. The molten material 64 has a sharp resonance in use of the droplet generator 60. One reason for the resonance being sharp may be that the molten material 64 has a relatively low viscosity. The closer the driving frequency is to the main resonance frequency of the molten material 64 in the capillary 61, the greater the resonance amplification.

In an embodiment the droplet generator 60 is arranged such that, in use, the driving frequency is sufficiently close to a main resonance frequency of the molten material 64 in the capillary 61, that the resonance amplification is at least ten times.

According to an exemplary embodiment, the main resonance frequency of the molten material 64 in the capillary 61 is about 72 kHz. When the driving frequency is 71 kHz, the resonance amplification is ten times. When the driving frequency is 73 kHz, the resonance amplification is about ten times. Accordingly, when the driving frequency is within about 1 kHz of the main resonance frequency, the resonance amplification is at least ten times. This significantly reduces the undesirable affects of any overtones in the capillary 61.

In an embodiment the droplet generator 60 is arranged such that, in use, the driving frequency is sufficiently close to the main resonance frequency of the molten material 64 in the capillary 61, that the resonance amplification is at least about 30% of the peak resonance amplification. In the example above, when the driving frequency is 72 kHz (i.e. the main resonance frequency) the resonance amplification is about 35 times. By having a driving frequency that is within about 1 kHz of the main resonance frequency of the molten material 64 in the capillary 61, the resonance amplification is about 30% of the peak amplification. Accordingly, using a driving frequency that is within about 1 kHz of the main resonance frequency of the molten material 64 in the capillary 61, the resonance amplification is at least about 30% of the peak amplification. This significantly reduces the undesirable effects of any overtones in the capillary 61.

The main resonance frequency of the molten material 64 in the capillary 61 depends particularly on the dimensions of the capillary 61. In an embodiment the droplet generator 60 is arranged such that, in use, the driving frequency is within about 2 kHz of the main resonance frequency of the molten material 64 in the capillary 61. Depending on the dimensions of the capillary 61 and the main resonance frequency, a difference of 2 kHz between the main resonance frequency and the driving frequency may be sufficiently small so as to significantly reduce the undesirable effects of overtones in the capillary 61.

In an embodiment the capillary 61 comprises a damper 67. The damper 67 is configured to dampen vibrations upstream of the damper 67. The damper 67 reduces the overtones of the capillary 61. The droplet generator 60 depicted in FIG. 6 may be modeled as a quarter wavelength resonator. Such a quarter wavelength resonator may have overtones at approximately three times, five times, etc. the first resonance frequency of the resonator. These resonance frequencies may be high Q resonance modes. In this case, even when the capillary 61 is driven at a driving frequency that is equal to the first resonance, the overtone resonances (i.e. at three times, five times etc of the first resonance) may be excited. This can lead to an undesirable disturbance of the coalescence process.

By providing the capillary 61 with a damper 67 the acoustics of the capillary 61 are changed such that the capillary 61 has only a single resonance frequency. In an embodiment the Helmholtz volume 68 of molten material 64 downstream of the damper 67 has a single resonance frequency, known as the Helmholtz resonance frequency. The damper 67 dampens vibrations upstream of the damper 67 such that other vibrations within the molten material 64 do not affect the Helmholtz resonance frequency of the Helmholtz volume 68.

In an embodiment the damper 67 comprises a portion of the capillary 61 that has a reduced inner cross sectional area. This is depicted in FIG. 7, for example. The shape of the cross sectional area of the damper 67 is not particularly important. For example, the cross sectional area of the damper 67 may be round, or may have any other shape. This is because the shape of the cross sectional area of the damper 67 does not significantly influence the acoustics of the capillary 61. Instead, only the length of the damper 67 and the cross sectional area of the damper 67 have a significant affect on the acoustics of the capillary 61. The cross sectional area of the damper 67 may be triangular, or square for example.

In an embodiment the damper 67 is formed by heating the portion of the capillary 61 that forms the damper 67. This portion of the capillary 61 shrinks so as to narrow the channel inside the capillary 61.

In an embodiment the capillary 61 comprises an upstream end mounted into a stiff housing 65. The stiff housing 65 may be a connection to a reservoir 69 for holding the molten material 64. In an embodiment the damper 67 comprises an upstream end adjacent to the stiff housing 65. The distance between the upstream end of the damper 67 and the point at which the capillary 61 emerges from the stiff housing 65 is substantially zero.

However, this need not necessarily be the case. The distance between the upstream end of the damper 67 and the stiff housing 65 can be freely varied.

In an embodiment the capillary 61 comprises a portion downstream of the damper 67. As shown in FIG. 7, this portion may correspond to the Helmholtz volume 68 of molten material 64. In an embodiment the portion (i.e. Helmholtz volume 68) has a volume less than or equal to about 1 mm$^3$, and optionally less than or equal to about 0.1 mm$^3$. The smaller the Helmholtz volume 68, the higher the main resonance frequency of the molten material 64 in the capillary 61. The size of the Helmholtz volume 68 may be varied so as to achieve the main resonance frequency as desired.

In an embodiment the capillary 61 comprises a portion downstream of the damper 67, wherein the actuator 62 surrounds at least part, and optionally substantially all, of the portion. In an embodiment the actuator 62 surrounds at least part, and optionally substantially all, of the Helmholtz volume 68.

In an embodiment the actuator 62 is positioned around the Helmholtz volume 68. In an embodiment the actuator 62 is configured to substantially enclose the Helmholtz volume 68. Beyond the Helmholtz volume 68, the positioning and extent of the actuator 62 can be freely varied. In an embodiment the actuator 62 extends to the nozzle 66. In an embodiment the actuator 62 extends to the downstream end of the damper 67. In an embodiment the actuator 62 extends to the upstream end of the damper 67. In an embodiment the actuator 62 extends substantially to the stiff housing 65.

In an embodiment the driving frequency is for controlling coalescence of droplets generated by the droplet generator 60. The driving frequency is the low frequency signal (in the region of kHz) for coalescence of smaller droplets into larger droplets of molten materials 64. The driving signal also includes a higher frequency element configured to control the breakup of the jet of molten material into relatively small droplets.

In an embodiment the capillary 61 comprises a downstream end having a nozzle 66 configured to eject droplets. In an embodiment an inner cross sectional area of the capillary 61 decreases towards the nozzle 66. This is shown in FIGS. 6 and 7, for example, where the inner diameter of the capillary tapers towards the nozzle 66. The shape of the taper can be freely varied.

In an embodiment the droplet generator 60 comprises a molten material reservoir 69. The molten material reservoir 69 is configured to generate a molten material flow in the capillary 61. In an embodiment pressure is applied to the molten material reservoir 69 so as to generate the flow of molten material in the capillary 61.

In an embodiment the molten material reservoir 69 is a molten tin reservoir. However, this need not necessarily be the case. For example, instead of molten tin, molten xenon (i.e. xenon cooled to a molten state) or molten lithium (which has a similar melting point to tin of about 180° C.) may be used.

In an embodiment, in use of the droplet generator 60, the main resonance frequency of the molten material is greater than or equal to about 80 kHz.

In an embodiment the controller 63 is configured to drive the actuator 60 to the driving frequency with a block pulse. If a block pulse is used, the main frequency of the block pulse would be the lower frequency driving frequency of the signal for controlling coalescence of droplets. The higher frequency overtones may be used to control breakup of the jet of molten material 64 into smaller droplets.

Instead of a block pulse, the controller 63 may be configured to provide only the two driving frequencies required, i.e. one lower driving frequency for controlling coalescence, and one higher driving frequency for controlling droplet breakup).

In an embodiment the capillary is made of glass. However, other materials, that are compatible for use with the molten material may be used. For example, molybdenum or titanium may be used because these materials are compatible for use with molten tin.

In an embodiment the capillary 61 has a length of at least about 25 mm. In an embodiment the capillary 61 has a length of at most about 50 mm. In an embodiment the capillary 61 has an inner diameter of at least about 0.5 mm. In an embodiment the capillary 61 has an inner diameter of at most about 1.0 mm. In an embodiment the capillary 61 has a wall thickness of at least about 0.1 mm. In an embodiment the capillary 61 has a wall thickness of at most about 0.2 mm. In an embodiment the nozzle has an inner diameter of at least about 3 µm. In an embodiment the nozzle 66 has an inner diameter of at most about 5 µm. In an embodiment the nozzle 66 has an inner diameter of at most about 10 µm.

In an embodiment the actuator 62 is a piezoelectric actuator. For example, the actuator 62 may be formed by a tube of piezoelectric ceramic. However, other types of actuator may also be used. In an embodiment the actuator 62 is mounted onto the capillary 61 by an adhesive, such as a high temperature resistance adhesive. In an embodiment the actuator 62 has a length of at least about 6 mm. In an embodiment the actuator 62 extends along at most about 10 mm of the capillary 61.

In an embodiment the damper 67 has an inner diameter of at least about 70 µm. In an embodiment the damper has an inner diameter of at most about 140 µm. In an embodiment the damper 67 has a length of at least about 0.3 mm. In an embodiment the damper 67 has a length of at most about 0.7 mm.

In an embodiment the Helmholtz volume 68 has a length of at least about 0.3 mm. In an embodiment the Helmholtz volume 68 has a length of at most about 0.7 mm. In an embodiment the Helmholtz volume 68 has an inner diameter of at least about 0.3 mm. In an embodiment the Helmholtz volume 68 has an inner diameter of about 0.6 mm. The inner diameter of the Helmholtz volume 68 is the mean inner diameter of the Helmholtz volume across its length. In an embodiment the distance between the stiff housing 65 and the upstream end of the damper 67 is at most about 10 mm, and optionally at most about 5 mm.

In order to get rid of the fluid resonances in the domain of applied low frequencies the part of the capillary 61, in which the pressure waves are generated that control the velocity distribution in the nozzle as a function time, is desirably as small as possible. That will result in fluid acoustics of the capillary 61 in which the resonances are well defined at the low frequency content of the pulse applied to the actuator 62 needed for controlled droplet coalescence. Other resonances are either weak or far from the low frequency driving frequency. An example of such a set-up is shown in FIG. 7. Such a set-up is referred to as a Helmholtz resonator.

FIG. 7 depicts a Helmholtz resonator type droplet generator. A Helmholtz resonator has just one resonance frequency, given by:

$$f \approx \frac{c}{2\pi} \sqrt{\frac{1}{V_c}\left(\frac{A_1}{L_1} + \frac{A_2}{L_2}\right)}$$

Here c is the speed of sound (corrected for the wall compliance), $A_1$, $L_1$ and $A_2$, $L_2$ the cross-sectional area and length of the nozzle 66 and the damper 67, respectively. The volume of fluid between nozzle and damping channel is given by $V_c$. The Helmholtz resonance does not contain overtones, so there is no danger of having driving signals that touch preferentially overtones and produce undesired droplet streams (smaller droplets at shorter inter droplet distances).

The cross-sectional area of the nozzle 66 is very small, while its length because of the slight taper is long; the cross-section of the damper 67 is much larger than that of the nozzle 66 so it is reasonable to skip the nozzle term of the equation as an approximation. For a damper 67 with 200 µm diameter and length 0.5 mm and a Helmholtz volume 68 of 0.5 mm length and 0.4 mm diameter the Helmholtz frequency is roughly 100 kHz.

Directly after the damper 67 the capillary 67 can be mounted in the housing 65 of the reservoir 69, making the whole construction much stiffer. The actuator 62 is mounted directly around the part of the capillary 61 surrounding the Helmholtz volume 68. Upstream vibrations are damped by the damper 67, also termed a damping channel. The main resonance of the droplet generator 60, the Helmholtz resonance is equal or about equal to the driving frequency of the droplet generator 60. Because of the damper 67 the gain of other modes is limited. All other resonances of the molten material, e.g. tin, in the capillary 61, either lower or higher than the main resonance frequency, are much weaker or far away from the main resonance frequency.

As the resonance frequency (Helmholtz frequency) of the fluid system is equal or about equal to the driving frequency for droplet coalescence, droplet coalescence will be more stable, and full coalescence will be reached at a shorter distance.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g. diameter) of 300 mm or 450 mm or any other size.

The descriptions above are intended to be illustrative, not limiting. Thus, it will be apparent to one skilled in the art that modifications may be made to the invention as described without departing from the scope of the claims set out below.

The invention claimed is:

1. A droplet generator, for an EUV radiation source, comprising:
   a capillary in which, in use, molten material flows;
   an actuator configured to modulate a pressure inside the capillary; and
   a controller configured to drive the actuator at a driving frequency;
   wherein the capillary comprises a Helmholtz resonator and a damper, configured to dampen vibrations upstream of the damper.

2. The droplet generator of claim 1, wherein the damper is arranged upstream of a Helmholtz volume of the Helmholtz resonator.

3. The droplet generator of claim 1, wherein the damper comprises a portion of the capillary that has a reduced inner cross sectional area.

4. The droplet generator of claim 1, wherein the capillary comprises an upstream end mounted into a stiff housing, wherein the damper comprises an upstream end adjacent the stiff housing.

5. The droplet generator of claim 1, wherein the capillary comprises a portion downstream of the damper, wherein the actuator surrounds at least part, and optionally substantially all, of said portion.

6. The droplet generator of claim 1, wherein the droplet generator is arranged such that, in use, the driving frequency is equal or about equal to a main resonance frequency of the molten material in the capillary.

7. The droplet generator of claim 6, wherein the driving frequency comprises a first, comparatively high, frequency to control a breakup of the molten material into relatively small droplets, and a second, comparatively low, frequency for coalescence of the relatively small droplets into larger droplets.

8. The droplet generator of claim 1, wherein the controller is configured to drive the actuator at the driving frequency with a block pulse.

9. An EUV radiation source comprising a droplet generator that comprises:
   a capillary in which, in use, molten material flows;
   an actuator configured to modulate a pressure inside the capillary; and
   a controller configured to drive the actuator at a driving frequency;
   wherein the droplet generator is arranged such that, in use, the driving frequency is equal or about equal to a main resonance frequency of the molten material in the capillary.

10. A lithographic apparatus comprising an EUV radiation source comprising a droplet generator that comprises:
    a capillary in which, in use, molten material flows;
    an actuator configured to modulate a pressure inside the capillary; and
    a controller configured to drive the actuator at a driving frequency;
    wherein the droplet generator is arranged such that, in use, the driving frequency is equal or about equal to a main resonance frequency of the molten material in the capillary.

11. A method for generating droplets for an EUV radiation source, said method comprising:
    flowing molten material in a capillary, wherein the molten material has a main resonance frequency in the capillary; and
    modulating a pressure inside the capillary at a driving frequency that is equal or about to said main resonance frequency.

12. A device manufacturing method using a lithographic apparatus, the method comprising the steps of:
    generating droplets for an EUV radiation source, wherein said generating step comprises:
       flowing molten material in a capillary, wherein the molten material in the capillary has a main resonance frequency; and
       modulating a pressure inside the capillary at a driving frequency that is equal or about equal to said main resonance frequency.

* * * * *